(12) United States Patent
Kim

(10) Patent No.: US 7,736,461 B2
(45) Date of Patent: Jun. 15, 2010

(54) CASSETTE FOR PREVENTING BREAKAGE OF GLASS SUBSTRATE

(75) Inventor: Dae Jeong Kim, Taegu-kwangyokshi (KR)

(73) Assignee: LG Display Co., Ltd., Seoul (KR)

( * ) Notice: Subject to any disclaimer, the term of this patent is extended or adjusted under 35 U.S.C. 154(b) by 100 days.

(21) Appl. No.: 10/424,760

(22) Filed: Apr. 29, 2003

(65) Prior Publication Data
US 2004/0065413 A1    Apr. 8, 2004

(30) Foreign Application Priority Data
Oct. 7, 2002    (KR) .................. 10-2002-0061052

(51) Int. Cl.
*C23F 1/00*    (2006.01)
*H01L 21/306*    (2006.01)
(52) U.S. Cl. ............................... 156/345.23
(58) Field of Classification Search ............ 156/345.11, 156/345.23
See application file for complete search history.

(56) References Cited

U.S. PATENT DOCUMENTS

| | | | | |
|---|---|---|---|---|
| 4,872,554 | A | * | 10/1989 | Quernemoen ................ 206/454 |
| 5,712,040 | A | * | 1/1998 | Nakahara et al. ............. 428/421 |
| 5,766,493 | A | | 6/1998 | Shin |
| 5,835,176 | A | | 11/1998 | Jeong et al. |
| H1762 | H | * | 12/1998 | Kaempf et al. ............... 206/710 |
| 6,086,127 | A | * | 7/2000 | Korn et al. .................... 294/159 |
| 6,197,209 | B1 | | 3/2001 | Shin et al. |
| 6,337,030 | B1 | * | 1/2002 | Sakaguchi .................... 216/91 |
| 6,523,701 | B1 | * | 2/2003 | Yoshida et al. ............. 211/41.18 |

FOREIGN PATENT DOCUMENTS

| | | | |
|---|---|---|---|
| JP | 2138459 | | 5/1990 |
| JP | 3022390 | | 1/1991 |
| JP | 03273664 A | * | 12/1991 |
| JP | 4116619 | | 4/1992 |
| JP | 5249422 | | 9/1993 |
| JP | 5249423 | | 9/1993 |
| JP | 7168172 | | 7/1995 |
| JP | 07273179 A | * | 10/1995 |
| KR | 10-1998-030906 | | 8/1998 |
| KR | 10-2001-0107033 | | 12/2001 |

OTHER PUBLICATIONS

English Machine Translation of JP07273179A, obtained from http://www.ipdl.ncipi.go.jp/homepg_e.ipdl on Mar. 8, 2005.*
USPTO English Translation of JP 07-273179 A. Obtained from Screiber Translations, Inc.; Mar. 2006.*

* cited by examiner

*Primary Examiner*—Parviz Hassanzadeh
*Assistant Examiner*—Maureen Gramaglia
(74) *Attorney, Agent, or Firm*—McKenna Long & Aldridge LLP

(57) ABSTRACT

A cassette capable of preventing breakage in glass substrates includes lower and upper frames; side frames between the lower and upper frames for connecting the lower and upper frames to each other, the side frames having a plurality of insertion recesses for receiving glass substrates; and a stopper at the rear of the cassette for preventing the glass substrates from exiting a rear portion of the cassette, wherein the stopper formed with a buffer covering material.

2 Claims, 3 Drawing Sheets

CASSETTE FOR PREVENTING BREAKAGE OF GLASS SUBSTRATE

This application claims the benefit of the Korean Application No. P2002-61052 filed on Oct. 7, 2002, which is hereby incorporated by reference for all purposes as if fully set forth herein.

BACKGROUND OF THE INVENTION

1. Field of the Invention

The present invention relates to a cassette for receiving a plurality of glass substrates, and more particularly, to a cassette for facilitating an etching of a plurality of glass substrates, wherein the cassette includes a stopper for preventing glass substrates from exiting a rear portion of the cassette.

2. Discussion of the Related Art

Flat panel display devices such as Liquid Crystal Displays (LCDs), Plasma Display Panels (PDPs), Electro-Luminescence Displays (ELD), and Vacuum-Fluorescent Displays (VFD) have recently been the subject of intense research and development. Of the aforementioned flat panel display devices, particular attention has been directed toward LCDs due to their ability to express images at a high resolution while consuming low amounts of power.

Despite the widespread applications of LCD devices as monitors of portable televisions and notebook computers, problems that need to be resolved still exist. For example, the weight and/or size of LCD devices must decrease to enable users to carry the LCD devices used in portable televisions or notebook computers. Even though various methods for decreasing the weight and/or size of LCD devices exist, it is desirable, though difficult, to decrease weight or size of essential elements within the LCD device using present techniques. For example, it is desirable to decrease the weight of glass substrates, the heaviest of the essential elements within the LCD device.

To decrease their weight, glass substrates are dipped into a container filled with an etchant and surfaces of the glass substrate are etched. However, according to the aforementioned etching process, the surface of a glass substrate may be unevenly etched when, for example, particles generated during the etching process are deposited on the surface of the glass substrate. Accordingly, the generated particles may form a sludge on an edge surface of the glass substrate.

LCD devices generally include LCD panels which typically include two glass substrates bonded together, wherein one glass substrate supports a color filter and the other supports a thin film transistor (TFT). By decreasing the weight of the glass substrates within the LCD panel, the overall weight of the LCD panel may be reduced. Accordingly, to reduce the weight of LCD panels, a glass substrate is etched at an etching station and, after being etched, is loaded to a cleaning station where particles deposited on the surface of the etched glass substrate are removed with distilled water. Next, the cleaned glass substrate is loaded into a drying station.

The etching station includes a container filled with an etchant such as a hydrofluoric acid (HF) solution. A cassette holding a plurality of glass substrates is dipped into the etchant within the etching station and, after the plurality of glass substrates in the cassette are etched, is loaded to a cleaning station where particles deposited on the surface of the etched glass substrates are removed with deionized (DI) water. At the cleaning station, the cassette moves upward and downward to allow the deionized water (DI) to be sprayed uniformly onto the plurality of glass substrates. Accordingly, the uniformly sprayed deionized (DI) water removes any HF solution remaining on the surfaces of the glass substrates and sludge formed at edges of the glass substrates. After the aforementioned cleaning process is performed twice, the cassette is loaded into the drying station. Accordingly, using the aforementioned cassette, a plurality of glass substrates, provided in a multi-layered arrangement, are etched simultaneously.

FIG. 1 illustrates a perspective view of a related art cassette used in etching a plurality of glass substrates. FIG. 2 illustrates a perspective view of the related art cassette shown in FIG. 1 having an altered orientation during an etching process.

Referring to FIGS. 1 and 2, a plurality of glass substrates 1 are received by the cassette 2 and are provided within the cassette 2 in a multi-layered arrangement. Two bar-shaped two stoppers 25 are formed at the rear of the cassette 2. The stoppers 25 prevent the plurality of glass substrates 1 from exiting a rear portion of the cassette 2 when the plurality of glass substrates 1 are loaded along substantially a horizontal direction into the cassette 2, oriented substantially vertically (as shown in FIG. 1). The stoppers 25 further prevent the plurality of glass substrates 1 from exiting a rear portion of the cassette 2 when the cassette 2 is oriented substantially horizontally (as shown in FIG. 2).

The related art cassette 2 and stoppers 25 are formed of PVC, a material resistant to etchant. Forming the related art cassette 2 and stopper 25 of PVC, however, is disadvantageous because PVC has a hard surface and may crack or scratch the glass substrates 1. Side portions of the glass substrates 1 are susceptible to breaking upon exposure to external impacts. When the cassette 2 is oriented between its horizontal and vertical positions, the glass substrates 1 may collide with the stoppers 25. Accordingly, the side portions of the glass substrate 1 that collide with the stoppers 25 may break or crack. Further, glass substrates 1 containing cracks may subsequently be broken as a result of being pressed.

SUMMARY OF THE INVENTION

Accordingly, the present invention is directed to a cassette capable of preventing breakage in glass substrates that substantially obviates one or more problems due to limitations and disadvantages of the related art.

An advantage of the present invention provides a cassette capable of preventing breakage in glass substrates, wherein the cassette includes a stopper coated with a ductile material capable of preventing the glass substrate from being broken when glass substrates collide with the stopper.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, a cassette capable of preventing breakage in glass substrates may, for example, include lower and upper frames; a plurality of side frames between the lower and upper frames for connecting the lower and upper frames to each other, wherein the side frames have a plurality of insertion recesses for receiving a plurality of glass substrates; and a stopper provided at the rear of the cassette for preventing the glass substrates from exiting a rear portion of the cassette, wherein the stopper is formed with a buffer covering material.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 3:
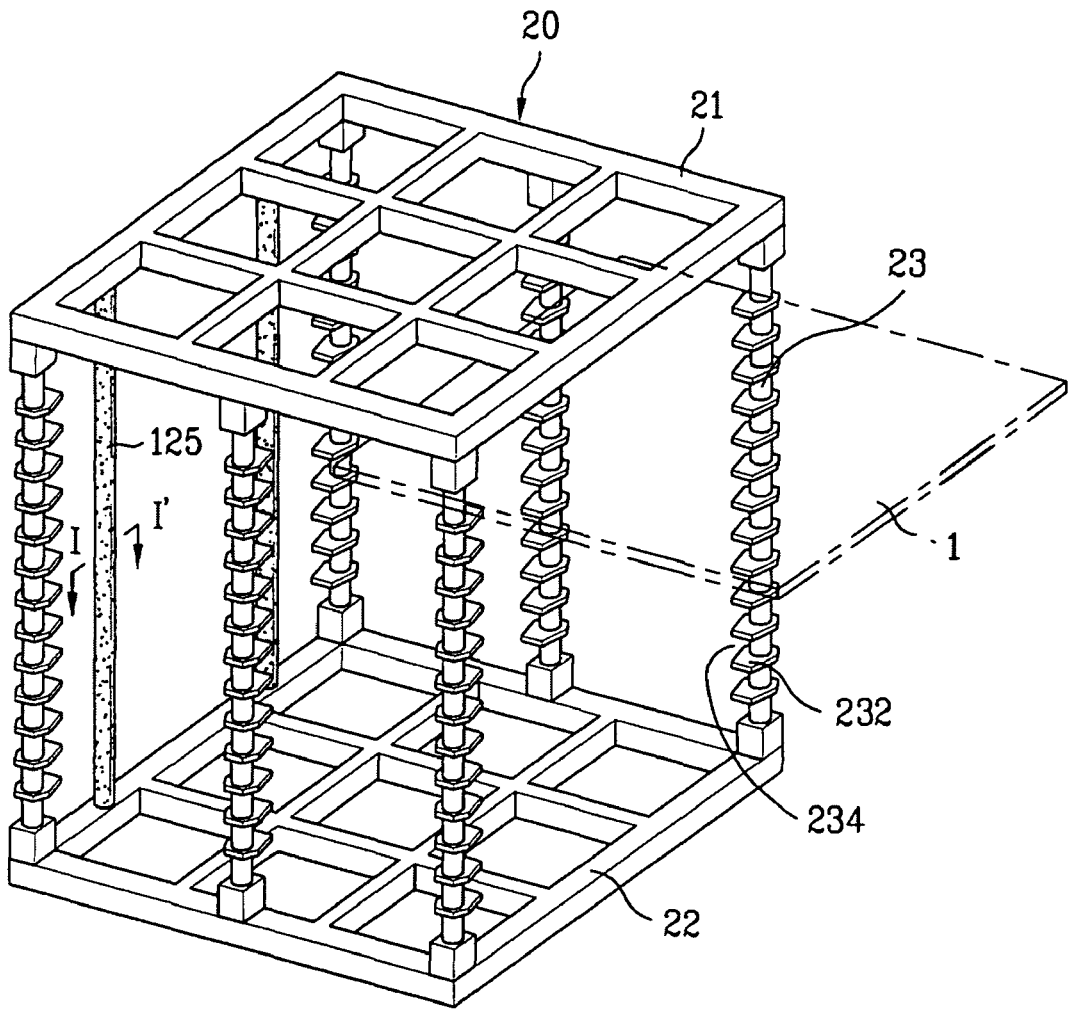
FIG. 3 illustrates a perspective view of a cassette capable of preventing breakage of glass substrates according to the principles of the present invention.

FIG. 3 illustrates a perspective view of a cassette capable of preventing breakage of glass substrates according to the principles of the present invention.

Referring to FIG. 3, a cassette 20 may have an external shape that is substantially a rectangular parallelepiped. In one aspect of the present invention, the cassette 20 may have a frame shape including left, right, rear, and front sides, wherein the front side is substantially open. In another aspect of the present invention, at least four side frames 23 may be arranged between lower and upper frames 22 and 21. In still another aspect of the present invention, between four and six side frames 23 may be arranged between lower and upper frames 22 and 21. When the glass substrates 1, received within the cassette 20, are relatively small in size, four side frames 23 may be arranged between lower and upper frames 22 and 21. However, when the glass substrates 1, received within the cassette 20, are relatively large in size, six side frames 23 may be arranged between lower and upper frames 22 and 21.

In one aspect of the present invention, a plurality of protrusions 232, protruding toward the inside of the cassette 20, may be provided along an entire length of the side frame 23. In another aspect of the present invention, the plurality of protrusions 232 may be formed at fixed intervals along the length of the side frame 23, wherein an insertion recess 234 may be provided between the protrusions 232 for receiving a the glass substrate 1.

Due to the presence of the plurality of insertion recesses 234, the cassette 20 may receive and simultaneously support between about twenty to about forty glass substrates 1. In one aspect of the present invention, opposing surfaces of adjacent ones of the glass substrates 1 may be prevented from contacting each other due to the presence of the plurality of insertion recesses 234.

According to the principles of the present invention, structures at left and right sides of the cassette 20 may be substantially symmetrical with respect to each other, while structures of the lower and upper sides of the cassette may also be substantially symmetrical with respect to each other. The structure of the front side of the cassette 20, however, is different from the structure of the rear side of the cassette 20. As shown in FIG. 3, the front side of the cassette 20 generally includes a single, open space between the two side frames 23, through which glass substrates 1 may be received. The rear side of the cassette 20, however, may include at least two stoppers 125 formed between the side frames 23. In one aspect of the present invention, the at least two stoppers 125 may be bar-shaped. In another aspect of the present invention, the at least two stoppers 125 may be coupled to the lower and upper frames 22 and 21.

Figure 1:
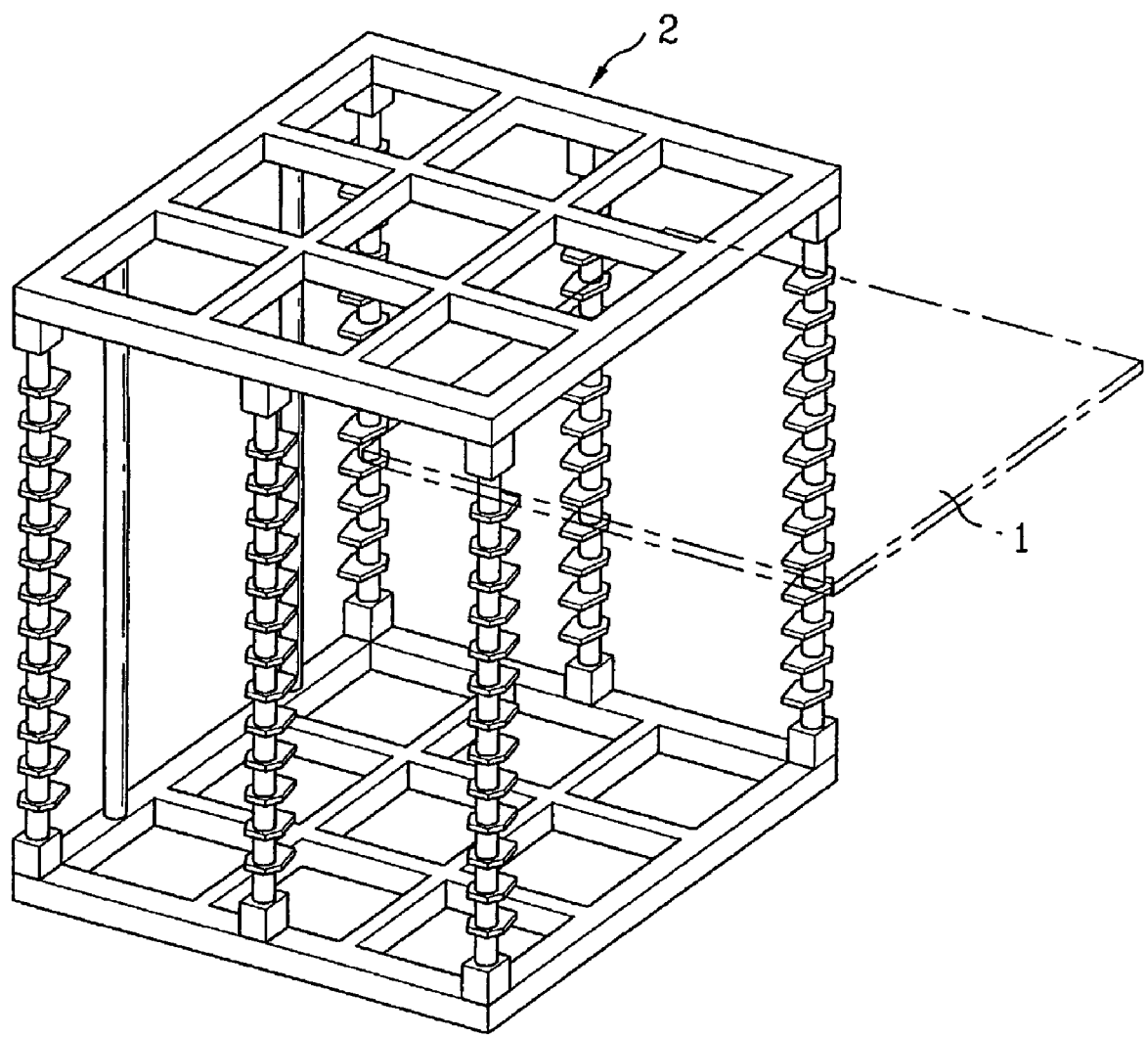
FIG. 1 illustrates a perspective view of a related art cassette used in etching a plurality of glass substrates.
Figure 2:
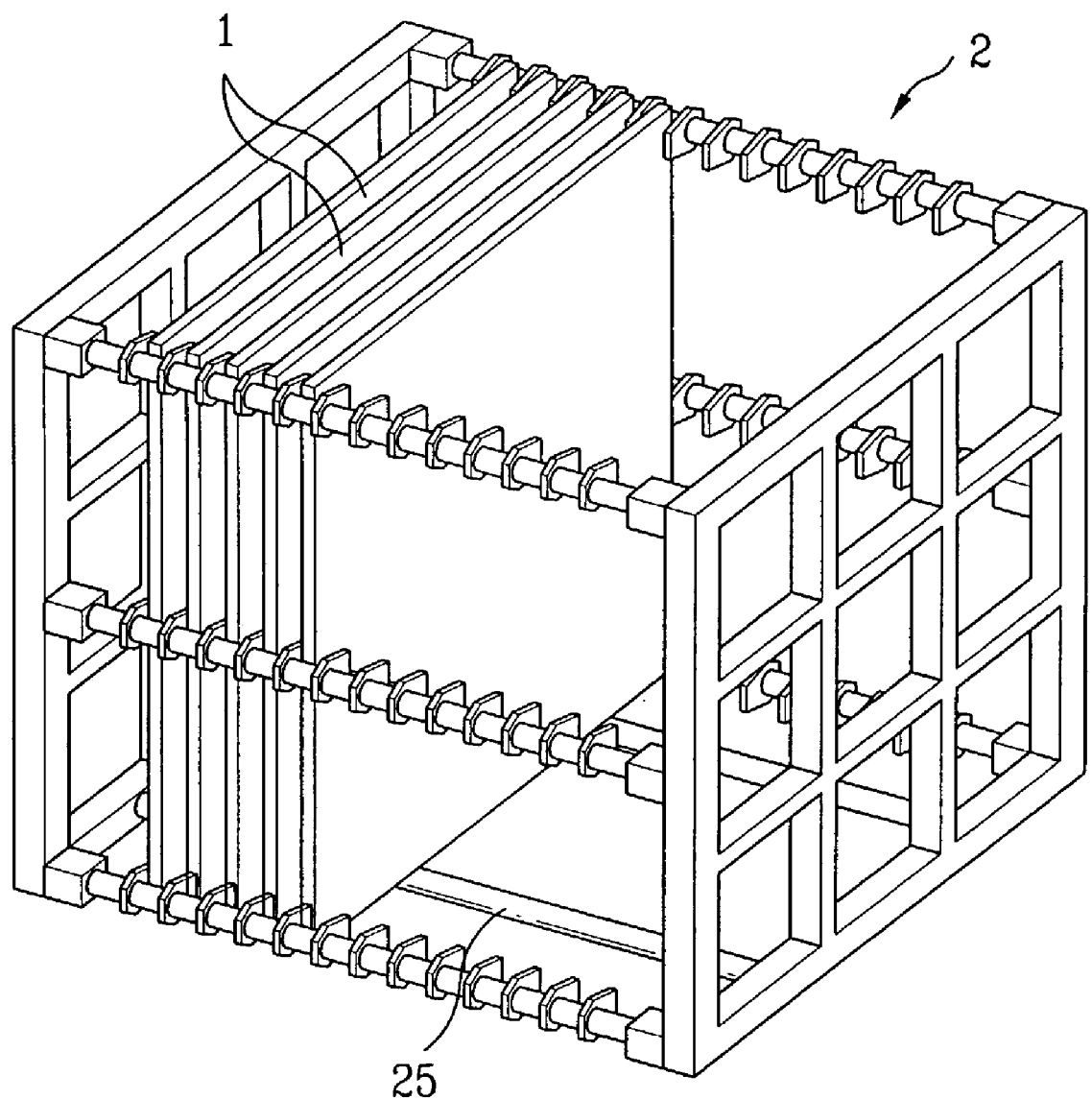
FIG. 2 illustrates a perspective view of the related art cassette shown in FIG. 1 having an altered orientation during an etching process.

According to the principles of the present invention, a plurality of the glass substrates 1 may be received within the cassette 20 by horizontally loading the plurality of glass substrates 1 into a substantially vertically oriented cassette 20. In one aspect of the present invention, the loading may be performed via a worker or a robot. Next, the cassette 20 may be manipulated to have a substantially horizontal orientation, similar to that shown in FIG. 2, and an etching process may be performed to the plurality of glass substrates 1, substantially vertically oriented within the cassette 20. Accordingly, the at least two stoppers 125 may prevent the glass substrates 1 from exiting a rear portion of the cassette 20.

During the etching process, the glass substrates may be etched within a container. After the etching is complete, a cleaning process may be performed whereby deionized water (DI) is sprayed onto the etched glass substrates. Subsequently, the cleaned glass substrates may be dried by exposing the cleaned substrates to a stream of nitrogen gas ($N_2$). Next, the substantially horizontally oriented cassette 20 may be manipulated to have the substantially vertical orientation and the glass substrates 1 may then be unloaded from the cassette 20. Upon manipulating the cassette 20 between substantially horizontal and vertical orientations, and vice-versa, rear sides of the glass substrates 1 may collide with, otherwise press against, the at least two stoppers 125.

Figure 4:
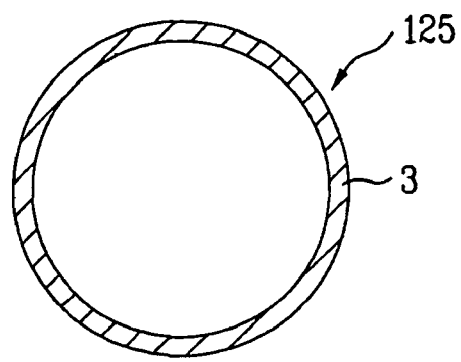
FIG. 4 illustrates a cross-sectional view of a stopper of the cassette taken along line I-I' as shown in FIG. 3.

FIG. 4 illustrates a cross-sectional view of a stopper of the cassette taken along line I-I' as shown in FIG. 3.

Referring to FIG. 4, a buffer covering material 3 may be formed on the surface of the stopper 125. In one aspect of the present invention, the buffer covering material 3 may comprise an electrically insulating material having a non-adhesive property, resistance to heat, chemicals, and abrasion. In another aspect of the present invention, the buffer covering material 3 may comprise a material having increased ductility compared materials such as PVC. In yet another aspect of the present invention, the buffer covering material 3 may comprise a material including a fluoric resin such as TEFLON (e.g., Poly Tetra Fluoro Ethylene (PTFE), Fluorinated Ethylene Propylene (FEP), Per Fluoro Alkoxy (PFA), etc.) or other material having a hardness and abrasion resistance due to the presence of particular organic compounds, may be formed during a TEFLON coating process. The buffer covering material 3 may be formed over an existing material such as iron, stainless steel, aluminum, copper, glass, rubber, ceramic, plastic, etc., by any method such as spraying, powder electrostatic coating, heating, and baking processes, or combinations thereof.

In order to perform the aforementioned etching process, the plurality of glass substrates 1 may be received inside a substantially vertically oriented cassette 20. Next, the cassette 20 may be manipulated such that it is oriented substantially horizontally, wherein the front side of the cassette 20, through which the glass substrates 1 were inserted, faces upward and the plurality of glass substrates are oriented substantially vertically. Accordingly, rear sides of the glass substrates 1 may collide with, or otherwise press against, the at least two stoppers 125.

According to the principles of the present invention, the at least two stoppers 125 may be coated with the buffer covering layer 3. Accordingly, when the glass substrates 1 move toward the rear side of the cassette 20 during the etch process, or when the glass substrates 1 collide with, or press against, the at least two stoppers 125, during a manipulation of the cassette 20 between substantially horizontal and vertical orientations, or vice versa, the glass substrates 1 may be prevented from being at least partially broken since the buffer covering layer 3 serves as a buffering material. Also, cracks may be prevented from being generated within the glass substrates 1 during scribe and breaking processes capable of dividing the glass substrates 1 into smaller panels for use in LCD panels.

Although it is shown in FIG. 4 that the at least two stoppers 125 have a cross-section that is substantially circular in shape, it will be appreciated that the at least two stoppers 125 may have cross section that is characterized by substantially any shape.

According to the principles of the present invention, a cassette capable of preventing breakage in glass substrates is advantageous because the buffer covering layer 3 serves as a buffering material, preventing the glass substrates from being broken upon contact with the at least two stoppers 125, thereby improving yield.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A cassette for preventing breakage in a glass substrate, comprising:
   a lower frame having a first surface and a second surface opposing the first surface;
   an upper frame having a third surface and a fourth surface opposing the third surface;
   a plurality of side frames between the lower and upper frames for connecting the lower and upper frames to each other, wherein the first and third surfaces oppose each other and wherein the side frames include a plurality of insertion recesses and a plurality of protrusions for receiving a plurality of glass substrates and at least two of the side frames are on opposite sides of the cassette with their protrusions extending towards one another;
   at least one stopper at a rear portion of the cassette for preventing the glass substrates from exiting the rear portion of the cassette, wherein a distance between the second and fourth surfaces defines the maximum length of the cassette; and
   a buffer covering material formed on the surface of the stopper and being formed of a material having a hardness and abrasion resistance due to the presence of particular organic compound;
   wherein the at least one stopper is made of rubber, and wherein the plurality of side frames includes at least four side frames.

2. A cassette, comprising:
   a lower frame having a first surface and a second surface opposing the first surface;
   an upper frame having a third surface and a fourth surface opposing the third surface and being spaced apart from the lower frame;
   at least one stopper coupled to the lower and upper frames wherein the first and third surfaces oppose each other and wherein a distance between the second and fourth surfaces defines the maximum length of the cassette;
   a buffer covering material covering an entire surface of the at least one stopper that is contactable by a glass substrate wherein the buffer covering material is formed of a material having a hardness and abrasion resistance due to the presence of particular organic compound; and
   a plurality of side frames coupled between the lower and upper frames, each of the plurality of side frames comprising at least one insertion recess and least one protrusion for receiving a glass substrate and at least two of the side frames are on opposite sides of the cassette with their protrusions extending towards one another;
   wherein the at least one stopper is made of rubber, and wherein the plurality of side frames includes at least four side frames.

* * * * *